(12) United States Patent
Ye

(10) Patent No.: US 11,316,120 B2
(45) Date of Patent: Apr. 26, 2022

(54) FLEXIBLE SUBSTRATE AND DISPLAY PANEL

(71) Applicant: Wuhan China Star Optoelectronics Semiconductor Display Technology Co., Ltd., Wuhan (CN)

(72) Inventor: Jian Ye, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 350 days.

(21) Appl. No.: 16/495,300

(22) PCT Filed: Apr. 26, 2019

(86) PCT No.: PCT/CN2019/084472
§ 371 (c)(1),
(2) Date: Sep. 18, 2019

(87) PCT Pub. No.: WO2020/155438
PCT Pub. Date: Aug. 6, 2020

(65) Prior Publication Data
US 2021/0376265 A1 Dec. 2, 2021

(30) Foreign Application Priority Data

Jan. 31, 2019 (CN) .......................... 201910098503.X

(51) Int. Cl.
*H01L 51/00* (2006.01)
*H01L 27/32* (2006.01)
*H01L 51/52* (2006.01)

(52) U.S. Cl.
CPC ...... *H01L 51/0097* (2013.01); *H01L 27/3276* (2013.01); *H01L 51/52* (2013.01)

(58) Field of Classification Search
None
See application file for complete search history.

(56) References Cited

U.S. PATENT DOCUMENTS

| 10,459,489 | B2* | 10/2019 | Yoo ......................... G06F 1/1658 |
| 10,795,224 | B2* | 10/2020 | Iwanaga ............... G02F 1/13454 |
| 2008/0078573 | A1* | 4/2008 | Hu ......................... H05K 1/0271 |
| | | | 174/262 |
| 2015/0173171 | A1* | 6/2015 | Kim ........................ H05K 1/028 |
| | | | 361/749 |
| 2015/0189755 | A1* | 7/2015 | Choi .................... G02F 1/13452 |
| | | | 361/749 |
| 2015/0189768 | A1* | 7/2015 | Kishida .................. H05K 1/028 |
| | | | 361/749 |
| 2016/0088726 | A1* | 3/2016 | Jeon ........................ H05K 1/147 |
| | | | 361/749 |
| 2016/0165726 | A1* | 6/2016 | Lee ......................... H05K 1/147 |
| | | | 361/749 |

(Continued)

FOREIGN PATENT DOCUMENTS

CN 105517329 A 4/2016
CN 108878482 A 11/2018

*Primary Examiner* — J. E. Schoenholtz

(57) ABSTRACT

The present invention provides a flexible substrate and a display panel. The flexible substrate comprises a substrate and a plurality of traces. The traces are disposed on the substrate. The substrate is further provided with a plurality of first via holes, and the first via holes are disposed along an extending direction of the traces.

16 Claims, 7 Drawing Sheets

(56) References Cited

U.S. PATENT DOCUMENTS

| | | | |
|---|---|---|---|
| 2018/0011514 A1* | 1/2018 | Yoo | G06F 1/1658 |
| 2018/0040672 A1* | 2/2018 | Park | H01L 27/323 |
| 2019/0164998 A1* | 5/2019 | Cho | G09G 3/3266 |
| 2019/0245156 A1* | 8/2019 | Kwon | G06F 3/044 |
| 2019/0278126 A1* | 9/2019 | Iwanaga | G02F 1/13454 |
| 2020/0077508 A1* | 3/2020 | Uogishi | H05K 3/1258 |

* cited by examiner

FLEXIBLE SUBSTRATE AND DISPLAY PANEL

FIELD OF INVENTION

The present invention relates to the field of display technologies, and in particular, to a flexible substrate and a display panel.

BACKGROUND OF INVENTION

Organic light emitting diodes (OLEDs) are used as current type light emitting devices, which have received wide attention due to self-illumination, rich color, fast response, wide viewing angles, light weight, and flexible display.

As products continue to upgrade, narrow frame design becomes a trend. The narrow frame design requires that width of the non-display area at the edge be reduced, especially the width of the lower frame. At present, a commonly used packaging scheme is to bend the flexible substrate to the back of the screen to realize a narrow frame design.

However, because the flexible substrate is bent to the back of the screen, there is a certain stress concentration in the bending area, and particularly the peripheral stress in the bending area is relatively large. Therefore, wiring disposed on the flexible substrate may be broken due to bending, thereby reducing product yield of the display panel.

Technical Problem

The technical problem solved by the present invention is how to reduce the stress of the flexible substrate in the bending area, and reduce the risk of breakage of the traces disposed on the flexible substrate due to bending, thereby improving the product yield of the display panel.

Technical Solution

In a first aspect, the present invention provides a flexible substrate, comprising:
a substrate; and
a plurality of traces disposed on the substrate;
wherein the substrate is further provided with a plurality of first via holes, and the first via holes are disposed along an extending direction of the traces;
wherein the first via holes are disposed between the adjacent traces; and
wherein the traces comprise a data line, a signal line, and a power line.

In the flexible substrate of the present invention, the substrate comprises a first side and a second side disposed opposite to each other, a third side and a fourth side are disposed between the first side and the second side, and the traces extend from the first side to the second side; and
the substrate is further provided with a first groove and a second groove, the first groove and the second groove are disposed opposite to each other, the first groove is disposed in the third side, and the second groove is disposed in the fourth side.

In the flexible substrate of the present invention, the first via holes are disposed between the first groove and the second groove.

In the flexible substrate of the present invention, a plurality of the first grooves are defined in the third side and spaced from each other, a plurality of the second grooves are defined in the fourth side and spaced from each other, and each of the first grooves corresponds to one of the second grooves.

In the flexible substrate of the present invention, a plurality of second via holes are further disposed in the substrate, the first via hole has a first end and a second end disposed opposite to each other, and wherein one of the second via holes is disposed at each of the first end and the second end, and the first via hole is connected to the second via holes.

In the flexible substrate of the present invention, width of the second via hole is greater than width of the first via hole.

In the flexible substrate of the present invention, the substrate has a bending area, the first via holes are disposed outside the bending area and are distributed at both sides of the bending area.

In the flexible substrate of the present invention, the first via hole disposed at one side of the bending area and the first via hole disposed at the other side of the bending area are symmetric with respect to an axis of the bending area.

In a second aspect, the present invention provides a flexible substrate, comprising:
a substrate; and
a plurality of traces, disposed on the substrate;
wherein the substrate is further provided with a plurality of first via holes, and the first via holes are disposed along an extending direction of the traces.

In the flexible substrate of the present invention, the substrate comprises a first side and a second side disposed opposite to each other, a third side and a fourth side are disposed between the first side and the second side, and the traces extend from the first side to the second side; and
the substrate is further provided with a first groove and a second groove, the first groove and the second groove are disposed opposite to each other, the first groove is disposed in the third side, and the second groove is disposed in the fourth side.

In the flexible substrate of the present invention, the first via holes are disposed between the first groove and the second groove.

In the flexible substrate of the present invention, a plurality of the first grooves are defined in the third side and spaced from each other, a plurality of the second grooves are defined in the fourth side and spaced from each other, and each of the first grooves corresponds to one of the second grooves.

In the flexible substrate of the present invention, a plurality of second via holes are further disposed in the substrate, the first via hole has a first end and a second end disposed opposite to each other, and wherein one of the second via hole is disposed at each of the first end and the second end, and the first via hole is connected to the second via hole.

In the flexible substrate of the present invention, width of the second via hole is greater than width of the first via hole.

The flexible substrate as claimed in claim 9, wherein the substrate has a bending area, the first via holes are disposed outside the bending area and are distributed at both sides of the bending area.

In the flexible substrate of the present invention, the first via hole disposed at one side of the bending area and the first via hole disposed at the other side of the bending area are axially symmetric with respect to an axis of the bending area.

In the flexible substrate of the present invention, the traces comprise a data line, a signal line, and a power line.

In a third aspect, the present invention provides a display panel, comprising a flexible substrate, wherein:
the flexible substrate comprises:
a substrate; and
a plurality of traces, disposed on the substrate;
wherein the substrate is further provided with a plurality of first via holes, and the first via holes are disposed along an extending direction of the traces.

Beneficial Effect

The beneficial effects of the present invention are that the risk of breakage of the traces disposed on the substrate due to bending can be reduced, thereby improving the product yield of the display panel.

DESCRIPTION OF DRAWINGS

In order to further understand the features and technical details of the present invention, please refer to the following detailed description and drawings regarding the present invention. The drawings are provided for reference and description only and are not intended to limit the present invention.

DETAILED DESCRIPTION OF PREFERRED EMBODIMENTS

Figure 1:
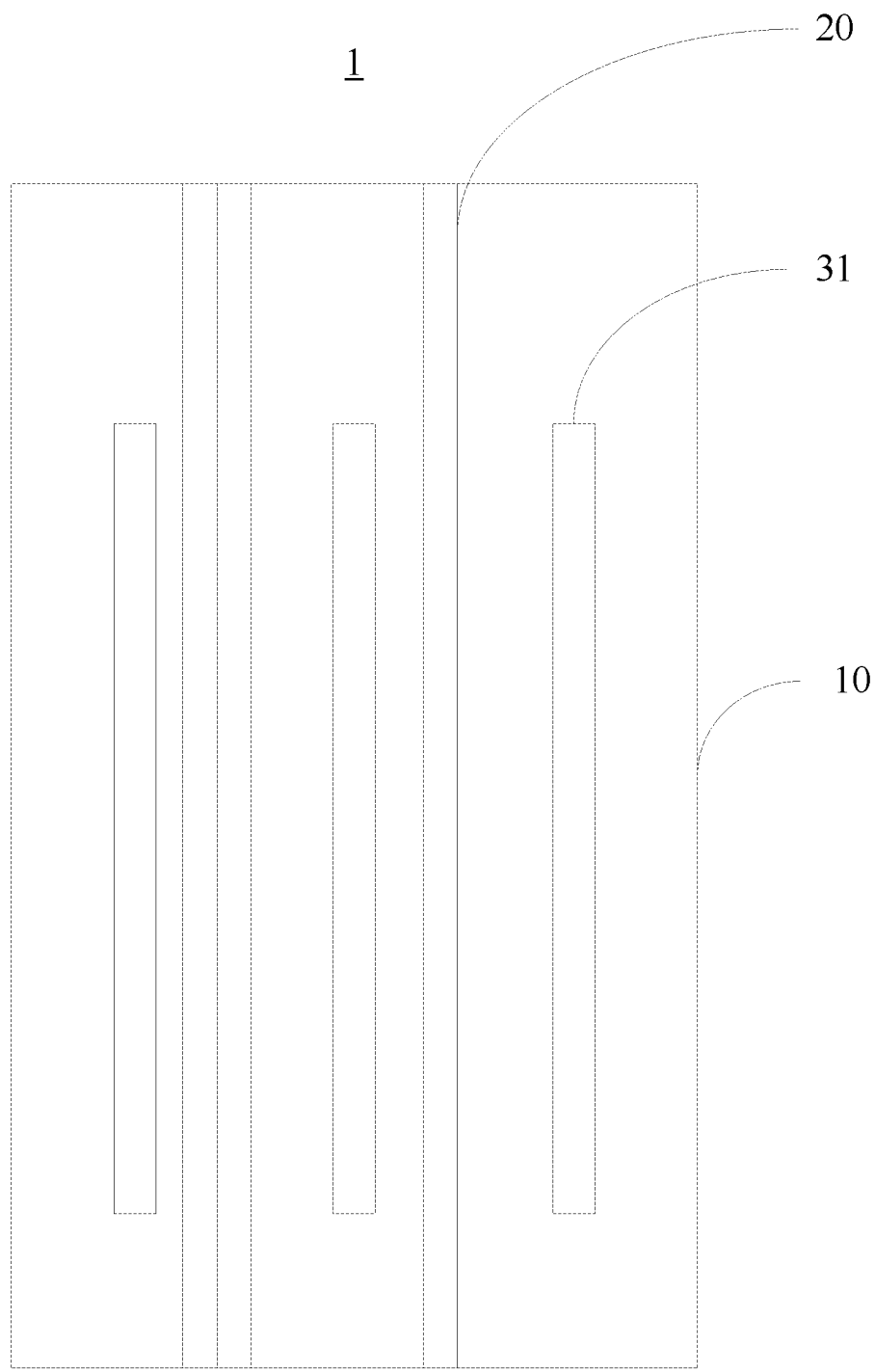
FIG. 1 is a schematic structural view of a first embodiment of a flexible substrate provided by the present invention.

Please refer to FIG. 1. FIG. 1 is a schematic structural view of a first embodiment of a flexible substrate provided by the present invention.

The present invention provides a flexible substrate 1. The flexible substrate 1 comprises a substrate 10, a plurality of traces 20, and a plurality of first via holes 30. The traces 20 are disposed on the substrate 10. The first via holes 30 are disposed in the substrate 10, and the first via holes 30 are disposed along an extending direction of the traces 20.

The substrate 10 can be a flexible substrate. The substrate 10 is provided with the traces 20, each of which extends along a predetermined direction, and the traces 20 may include one or more of a data line, a signal line, and a power line. The first via holes 31 may be elongated via holes. The first via holes 31 are disposed along an extending direction of the traces 20. For example, if the extending direction of the traces 20 is vertically downward, then the first via holes 31 are disposed in a vertically downward direction.

It should be noted that two opposite sides of one first via hole 31 may be provided with one trace 20. That is, the first via hole 31 is disposed between the two adjacent traces 20. Of course, the two sides of the first via hole 31 may be respectively provided with a plurality of traces. The specific setting is determined according to the actual situation and will not be described here.

The first via holes 31 are disposed in the substrate 10, and the first via holes 31 are disposed along the extending direction of the traces 20. When the flexible substrate 1 is bent, the first via holes 31 can disperse the stress, so that the risk of breakage of the traces 20 disposed on the flexible substrate 1 due to bending can be reduced, thereby improving product yield of the display panel.

Figure 2:
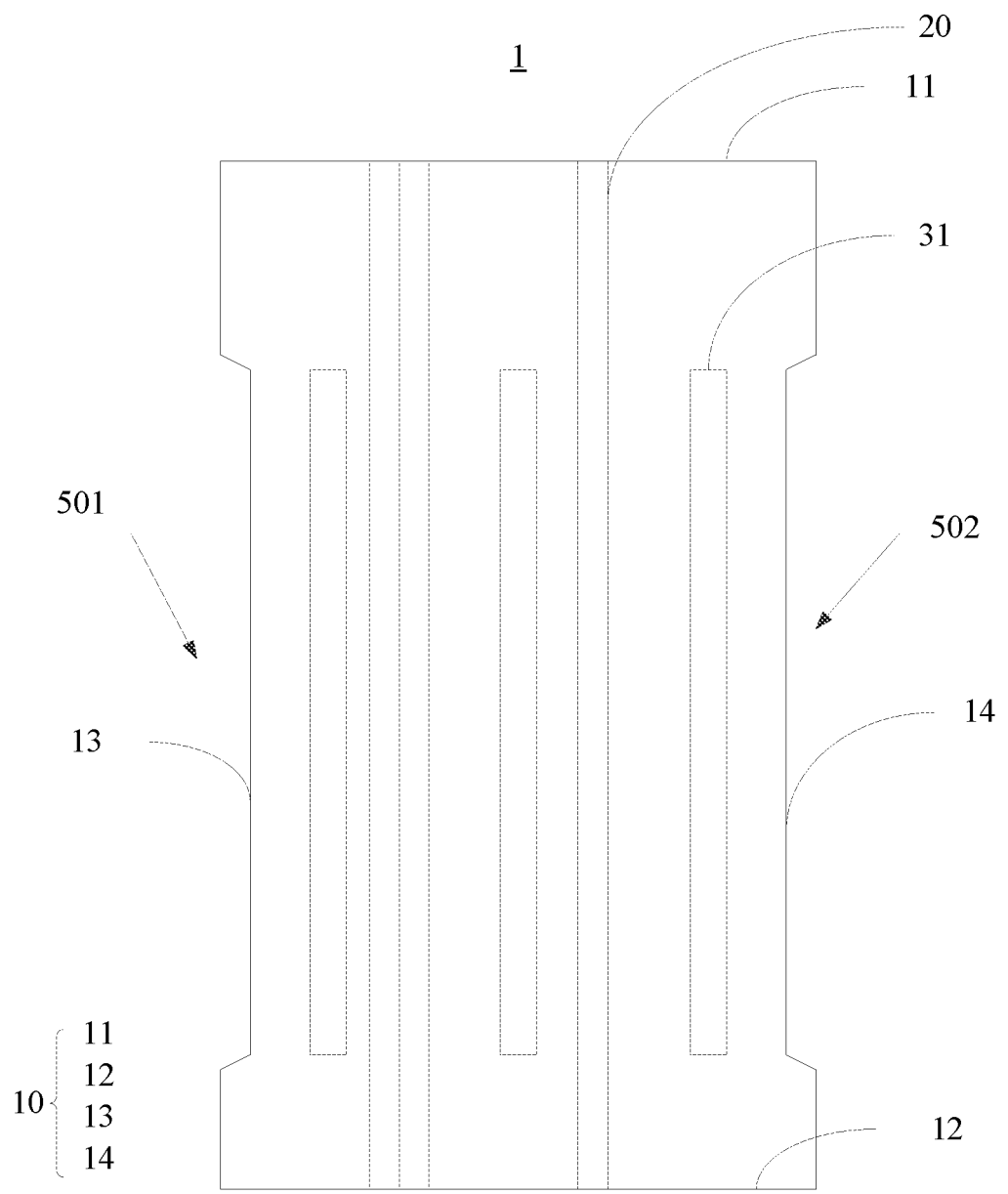
FIG. 2 is a schematic structural view of a second embodiment of the flexible substrate provided by the present invention.

Please refer to FIG. 2. FIG. 2 is a schematic structural diagram of a second embodiment of the flexible substrate provided by the present invention. The present invention also provides a flexible substrate 1. The difference between FIG. 2 and FIG. 1 is: the substrate 10 is further provided with a first groove 501 and a second groove 502.

The substrate 10 comprises a first side 11 and a second side 12 disposed opposite to each other, a third side 13 and a fourth side 14 are disposed between the first side 11 and the second side 12, and the traces 20 extend from the first side 11 to the second side 12. The first groove 501 and the second groove 502 are disposed opposite to each other, the first groove 501 is disposed in the third side 13, and the second groove 502 is disposed in the fourth side 14.

The first groove 501 is disposed in the third side 13 of the substrate 10, and the second groove 502 is disposed in the fourth side 14 of the substrate 10. When the flexible substrate 1 is bent, the first via holes 31, the first grooves 501, and the second grooves 502 are used to disperse the stress. Therefore, the risk of breakage of the traces 20 disposed on the flexible substrate 1 due to bending can be reduced, thereby improving the product yield of the display panel.

Referring to FIG. 2, one first via hole 31 is disposed between the first groove 501 and the second groove 502, which can further reduce the risk of the traces 20 disposed on the flexible substrate 1 being broken due to bending, and thereby improving the product yield of the display panel.

Figure 3:
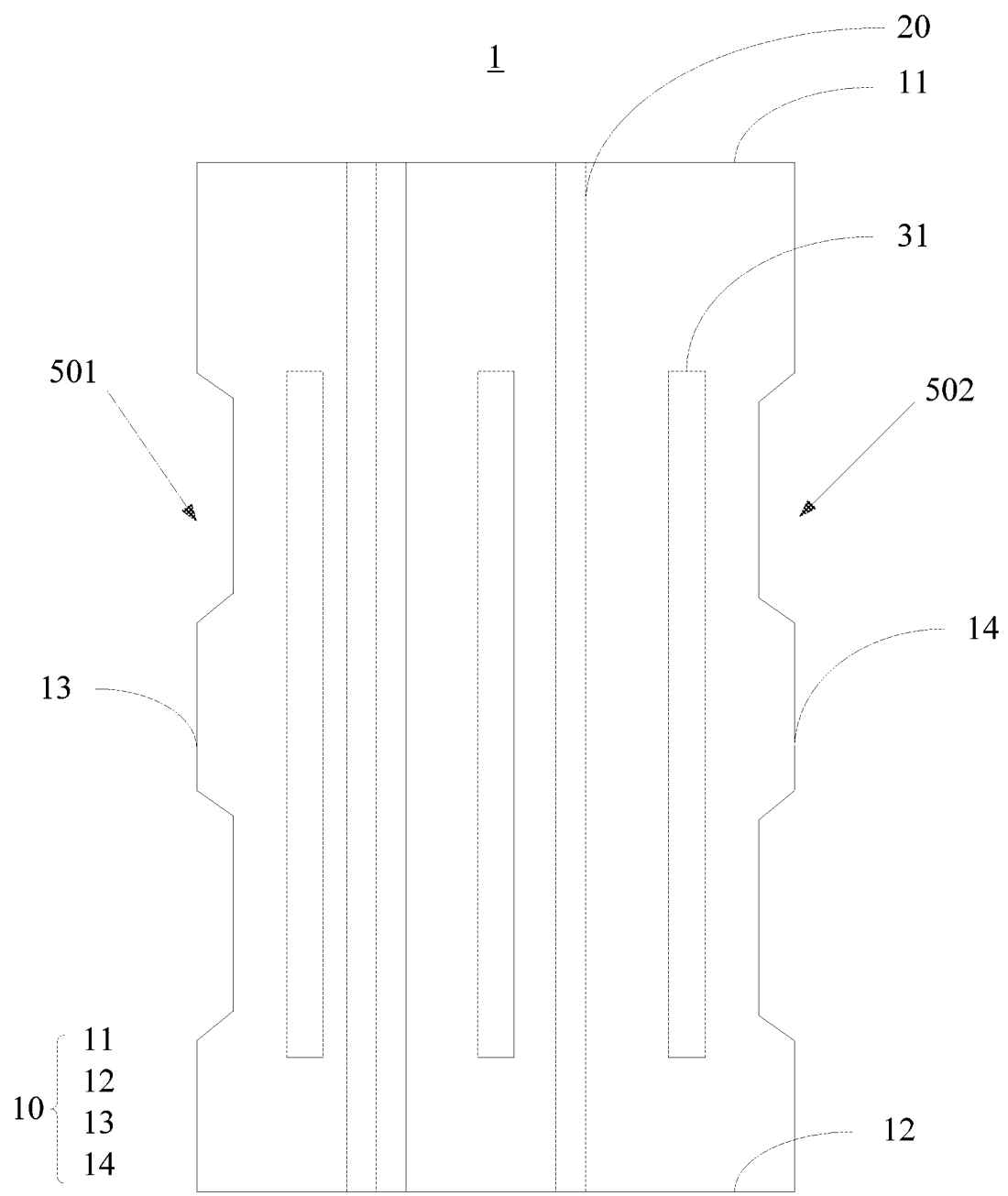
FIG. 3 is a schematic structural view of a third embodiment of the flexible substrate provided by the present invention.

Please refer to FIG. 3. FIG. 3 is a schematic structural diagram of a third embodiment of the flexible substrate provided by the present invention. The present invention further provides a flexible substrate 1. The difference between FIG. 3 and FIG. 2 is: the substrate 10 is provided with a plurality of first grooves 501 and a plurality of second grooves 502.

The first grooves 501 are defined in the third side 13 and spaced from each other, the second grooves 502 are defined in the fourth side 14 and spaced from each other. Each of the first grooves 501 corresponds to one of the second grooves 502. That is, the first groove 501 and the second groove 502 are symmetrically arranged with an axis, which is a center line of the substrate 10.

Because the first grooves 501 are disposed in the third side 13 of the substrate 10, the second grooves 502 are disposed in the fourth side 14 of the substrate 10, and the first grooves 501 and the second grooves 502 are symmetrically disposed, when the flexible substrate 1 is bent, the first grooves 501, the second grooves 502, and the first via holes 31 reduce the stress. That is, the traces 20 on the flexible substrate 1 do not break due to bending, which causes the flexible substrate 1 to fail, thereby causing the display panel to fail.

Figure 4:
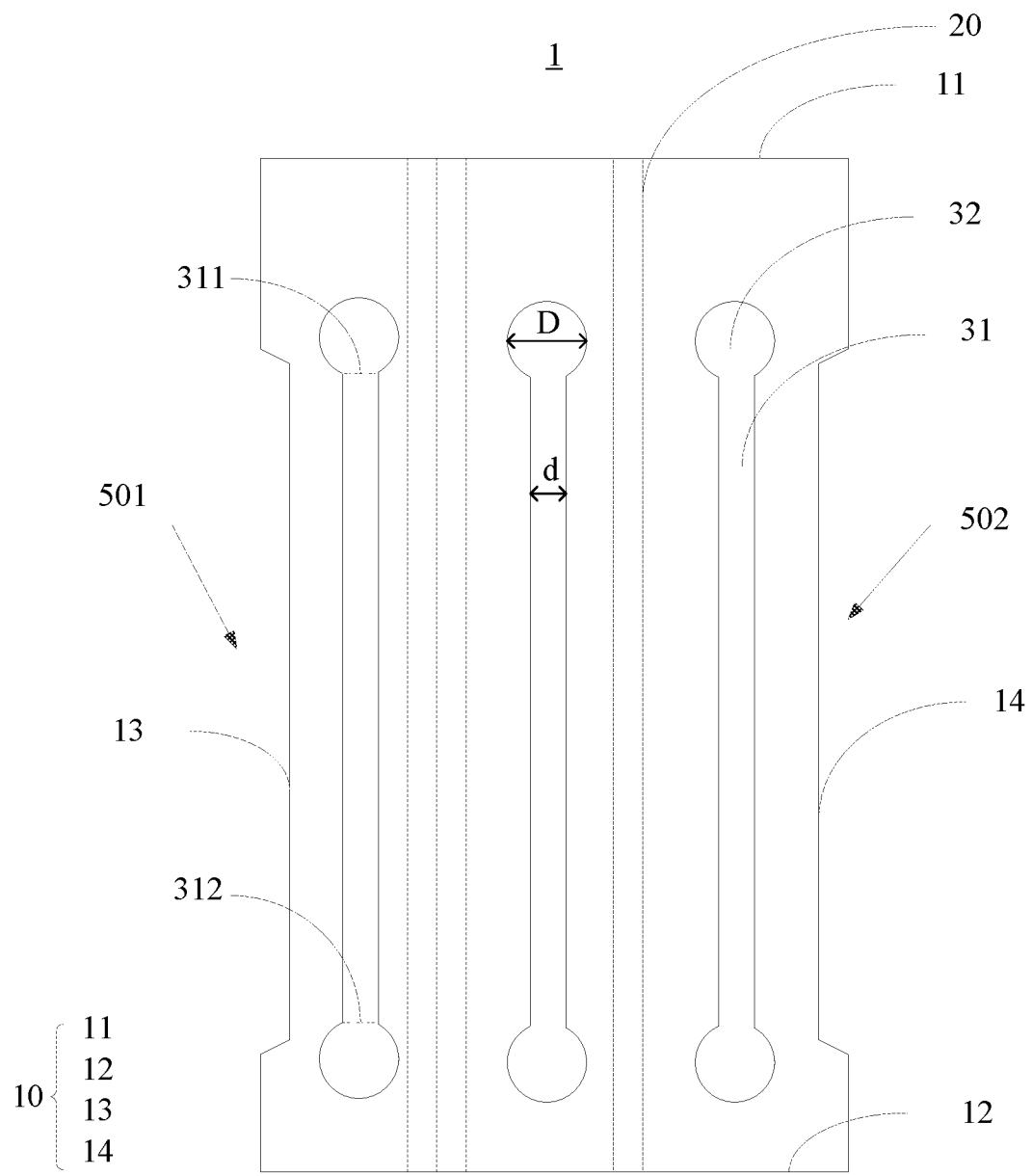
FIG. 4 is a schematic structural view of a fourth embodiment of the flexible substrate provided by the present invention.

Please refer to FIG. 4. FIG. 4 is a schematic structural diagram of a fourth embodiment of the flexible substrate provided by the present invention. The present invention further provides a flexible substrate 1. The difference between the flexible substrate 1 of FIG. 4 and the flexible substrate 1 of FIG. 1 is: a plurality of second via holes 32 are further disposed in the substrate 10.

The first via hole 31 has a first end 311 and a second end 312 disposed opposite to each other, and each of the first end 311 and the second end 312 are disposed with a second via holes 32 respectively. The first via hole 31 is connected to the second via holes 32.

For example, the first via hole 31 is an elongated via hole and the second via hole 32 is a circular via hole. First, the first via hole 31 can be opened in the flexible substrate 1 by a tool such as a cutter wheel. Then, on the basis of the first via hole 31, the second via hole 32 is opened in the first end 311 and the second end 312 of the first via hole 31, so that the first via hole 31 is connected to the second via holes 32. Of course, the first via hole 31 and the second via hole 32 can also be formed together.

The second via holes 32 disposed at both the first end 311 and the second end 312 of the first via hole 31 are used to prevent the first via hole 31 from being torn along the extending direction of the traces 20. At the same time, it is possible to further reduce the stress that the flexible substrate 1 is subjected to when bending. Therefore, the risk of breakage of the traces 20 disposed on the flexible substrate 1 due to bending can be reduced, thereby improving the product yield of the display panel.

In an embodiment, width D of the second via hole 32 is greater than width d of the first via hole 31.

Figure 5:
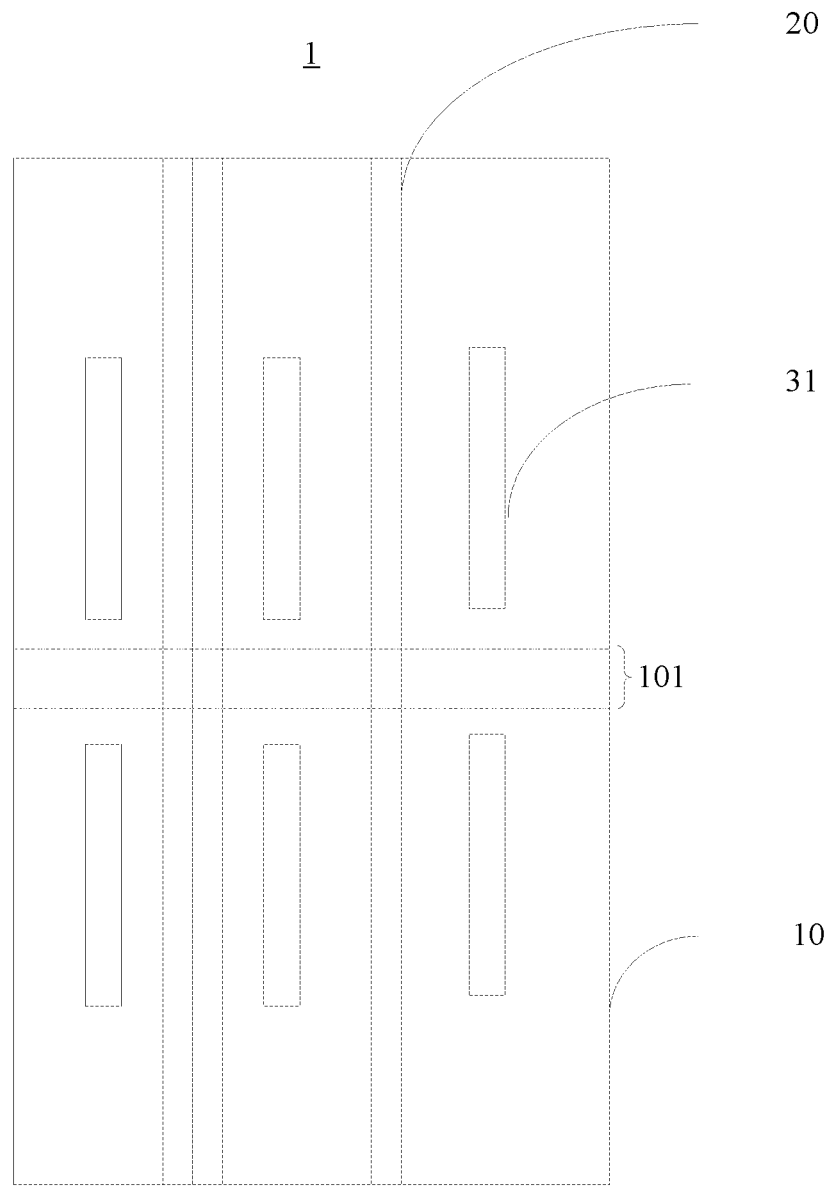
FIG. 5 is a schematic structural view of a fifth embodiment of the flexible substrate provided by the present invention.

Please refer to FIG. 5. FIG. 5 is a schematic structural diagram of a fifth embodiment of the flexible substrate provided by the present invention. The present invention further provides a flexible substrate 1. The difference of the flexible substrate 1 of FIG. 5 and the flexible substrate 1 of FIG. 1 is: a plurality of the first via holes 31 are disposed outside a bending area 101.

The substrate 10 has the bending area 101, the first via holes 31 are disposed outside the bending area 101 and are distributed at both sides of the bending area 101. Disposing the first via holes 31 outside the bending area 101 can reduce the generated stress when the flexible substrate 1 is bent, and reduce the risk of breakage of the traces 20 disposed on the flexible substrate 1 due to bending.

In an embodiment, the first via hole 31 disposed at one side of the bending area 101 and the first via hole 31 disposed at the other side of the bending area 101 are symmetric with respect to an axis of the bending area 101.

Figure 6:
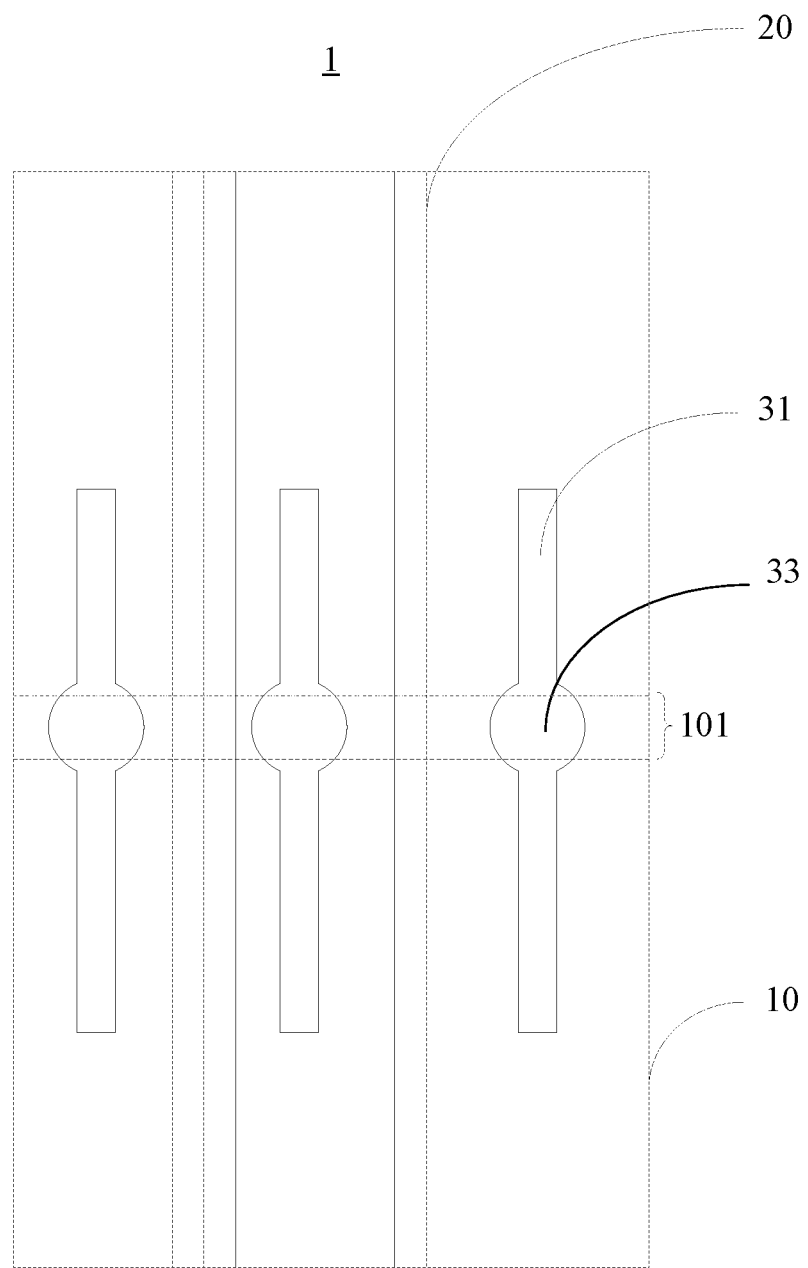
FIG. 6 is a schematic structural view of a sixth embodiment of the flexible substrate provided by the present invention.

Please refer to FIG. 6. FIG. 6 is a schematic structural diagram of a sixth embodiment of the flexible substrate provided by the present invention. The present invention further provides a flexible substrate 1. The difference between the flexible substrate 1 of FIG. 6 and the flexible substrate 1 of FIG. 5 is: both ends of the first via hole 31 are disposed with a third via hole 33, and the first via hole 31 disposed at one side of the bending area 101 is connected to the first via hole 31 disposed at the other side of the bending area 101 by the third via hole 33.

Figure 7:
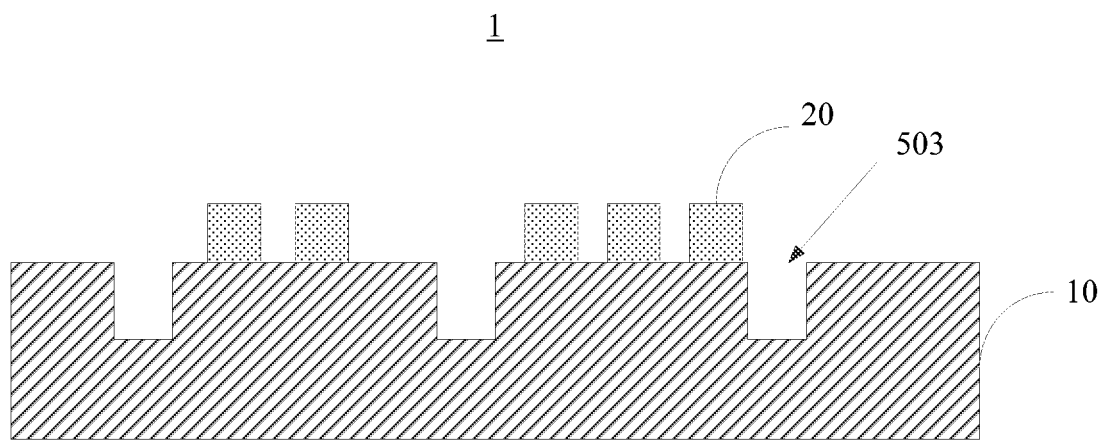
FIG. 7 is a schematic structural view of a seventh embodiment of the flexible substrate provided by the present invention.

Please refer to FIG. 7. FIG. 7 is a schematic structural diagram of a seventh embodiment of the flexible substrate provided by the present invention.

The present invention provides a flexible substrate 1 comprising a substrate 10, a plurality of traces 20, and a first groove 503. The traces 20 are disposed on the substrate 10, the first groove 503 is disposed in the substrate 10, and are disposed along an extending direction of the traces 20.

It should be noted that the difference between the flexible substrate 1 of FIG. 7 and any of the flexible substrates 1 of the previous embodiment is: the flexible substrate 1 of FIG. 7 is provided with a plurality of third grooves 503 in the substrate 10. The arrangement of the grooves 503 is the same as that of the previous embodiment, and details are not described herein again.

Correspondingly, the present invention also provides a display panel. The display panel includes a flexible substrate 1. The specific setting of the flexible substrate 1 can be referred to the previous embodiment, and details are not described herein again.

The flexible substrate and the display panel provided by the embodiments of the present invention are described in detail. The principles and implementations of the present invention are described in the specific examples. The description of the above embodiments is only for helping to understand the present invention. In the meantime, those skilled in the art will have various changes in the specific embodiments and application scopes according to the idea of the present invention. In summary, the content of the present specification should not be construed as limiting the present invention.

What is claimed is:

1. A flexible substrate, comprising:
    a substrate; and
    a plurality of traces disposed on the substrate;
    wherein the substrate is further provided with a plurality of first via holes and second via holes, the first via holes are disposed along an extending direction of the traces and have a first end and a second end disposed opposite to each other, the second via holes are disposed at the first end and the second end, and the first via holes are connected to the second via holes;
    wherein the first via holes are disposed between adjacent traces; and
    the traces comprise a data line and a power line.

2. The flexible substrate as claimed in claim 1, wherein the substrate comprises a first side and a second side disposed opposite to each other, a third side and a fourth side are disposed between the first side and the second side, and the traces extend from the first side to the second side; and
    the substrate is further provided with a first groove and a second groove, the first groove and the second groove are disposed opposite to each other, the first groove is disposed in the third side, and the second groove is disposed in the fourth side.

3. The flexible substrate as claimed in claim 2, wherein the first via holes are disposed between the first groove and the second groove.

4. The flexible substrate as claimed in claim 2, wherein a plurality of first grooves are defined in the third side and spaced apart from each other, a plurality of second grooves are defined in the fourth side and spaced apart from each other, and each of the first grooves corresponds to one of the second grooves.

5. The flexible substrate as claimed in claim 1, wherein a width of the second via holes is greater than a width of the first via holes.

6. The flexible substrate as claimed in claim 1, wherein the substrate has a bending area, the first via holes are disposed outside the bending area and are distributed at both sides of the bending area.

7. The flexible substrate as claimed in claim 6, wherein the first via holes disposed at one side of the bending area and the first via holes disposed at another side of the bending area are symmetrical about an axis of the bending area.

8. A flexible substrate, comprising:
    a substrate; and a plurality of traces disposed on the substrate;

wherein the substrate is further provided with a plurality of first via holes, and the first via holes are disposed along an extending direction of the traces; and the substrate has a bending area, the first via holes are disposed outside the bending area and are distributed at both sides of the bending area.

9. The flexible substrate as claimed in claim 8, wherein the substrate comprises a first side and a second side disposed opposite to each other, a third side and a fourth side are disposed between the first side and the second side, and the traces extend from the first side to the second side; and the substrate is further provided with a first groove and a second groove, the first groove and the second groove are disposed opposite to each other, the first groove is disposed in the third side, and the second groove is disposed in the fourth side.

10. The flexible substrate as claimed in claim 9, wherein the first via holes are disposed between the first groove and the second groove.

11. The flexible substrate as claimed in claim 9, wherein a plurality of first grooves are defined in the third side and spaced apart from each other, a plurality of second grooves are defined in the fourth side and spaced apart from each other, and each of the first grooves corresponds to one of the second grooves.

12. The flexible substrate as claimed in claim 8, wherein a plurality of second via holes are further disposed in the substrate, the first via holes have a first end and a second end disposed opposite to each other, the second via holes are disposed at the first end and the second end, and the first via holes are connected to the second via holes.

13. The flexible substrate as claimed in claim 12, wherein a width of the second via holes is greater than a width of the first via holes.

14. The flexible substrate as claimed in claim 8, wherein the first via holes disposed at one side of the bending area and the first via holes disposed at another side of the bending area are symmetrical about an axis of the bending area.

15. The flexible substrate as claimed in claim 8, wherein the traces comprise a data line and a power line.

16. A display panel, comprising a flexible substrate, wherein:

the flexible substrate comprises:

a substrate; and a plurality of traces disposed on the substrate;

wherein the substrate is further provided with a plurality of first via holes, and the first via holes are disposed along an extending direction of the traces; and the substrate has a bending area, the first via holes are disposed outside the bending area and are distributed at both sides of the bending area.

\* \* \* \* \*